United States Patent
Zhu

(10) Patent No.: US 12,484,407 B2
(45) Date of Patent: Nov. 25, 2025

(54) DISPLAY PANEL AND DISPLAY DEVICE

(71) Applicant: BOE TECHNOLOGY GROUP CO., LTD., Beijing (CN)

(72) Inventor: Jianchao Zhu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 225 days.

(21) Appl. No.: 18/333,280

(22) Filed: Jun. 12, 2023

(65) Prior Publication Data
US 2023/0329057 A1 Oct. 12, 2023

Related U.S. Application Data

(63) Continuation of application No. 17/788,794, filed as application No. PCT/CN2021/115903 on Sep. 1, 2021.

(30) Foreign Application Priority Data

Oct. 16, 2020 (CN) .......................... 202011110228.8

(51) Int. Cl.
*H10K 59/131* (2023.01)
*G09G 3/3233* (2016.01)
(Continued)

(52) U.S. Cl.
CPC ......... *H10K 59/131* (2023.02); *G09G 3/3233* (2013.01); *G09G 2300/0426* (2013.01);
(Continued)

(58) Field of Classification Search
CPC . H10K 59/131–1315; H10K 59/80515; H10K 59/80521; G09G 2300/0426;
(Continued)

(56) References Cited

U.S. PATENT DOCUMENTS

| | | | |
|---|---|---|---|
| 10,879,485 B2 | 12/2020 | Kim | |
| 2018/0151660 A1* | 5/2018 | Kim | ...................... H10K 59/88 |
| 2020/0203653 A1 | 6/2020 | Um et al. | |

FOREIGN PATENT DOCUMENTS

| | | |
|---|---|---|
| CN | 108133952 A | 6/2018 |
| CN | 111129093 A | 5/2020 |

(Continued)

OTHER PUBLICATIONS

WIPO, International Search Report issued on Nov. 15, 2021.

*Primary Examiner* — Daniel P Shook
(74) *Attorney, Agent, or Firm* — HOUTTEMAN LAW LLC

(57) ABSTRACT

The present disclosure provides a display panel and a display device. The display panel includes: a base substrate, on which a first metal layer and a second metal layer are stacked; and organic light emitting diode devices on a side, away from the base substrate, of the first metal layer. The first metal layer includes a power signal line. The power signal line is electrically connected with the second electrode layer in a peripheral area. Each organic light-emitting diode device includes a first electrode layer, a light emitting layer and a second electrode layer which are sequentially arranged on the base substrate. The second power signal line includes traces in a first direction and traces in a second direction, and orthographic projections of the traces in the first direction on the base substrate are intersected with orthographic projections of the traces in the second direction on the base substrate.

20 Claims, 9 Drawing Sheets

(51) Int. Cl.
*H10K 59/80* (2023.01)
*H10K 59/12* (2023.01)

(52) U.S. Cl.
CPC . *G09G 2300/0842* (2013.01); *H10K 59/1201* (2023.02); *H10K 59/80515* (2023.02); *H10K 59/80521* (2023.02)

(58) Field of Classification Search
CPC ......... G09G 2300/0842; G09G 3/3233; G09G 2310/0251
See application file for complete search history.

(56) References Cited

FOREIGN PATENT DOCUMENTS

| CN | 211150599 U | | 7/2020 |
|---|---|---|---|
| CN | 111554718 A | | 8/2020 |
| CN | 211265479 U | * | 8/2020 |

* cited by examiner forming a backplane on a base substrate, where the backplane includes a first metal layer and a first planarization layer which are sequentially stacked, and the first metal layer of each sub-pixel unit includes two longitudinal traces — S201 forming a first electrode layer, where the first electrode layer includes two protrusions which are respectively positioned right above the longitudinal traces — S202 forming a pixel defining layer, where the pixel defining layer is provided with a pixel opening, and the pixel opening is symmetrical with a central line between the two longitudinal traces as a symmetry axis — S203 forming a light emitting layer — S204 forming a second electrode layer, where the second electrode layer includes a recess, and the recess is symmetrical with the central line between the two longitudinal traces as a symmetry axis — S205

FIG. 13

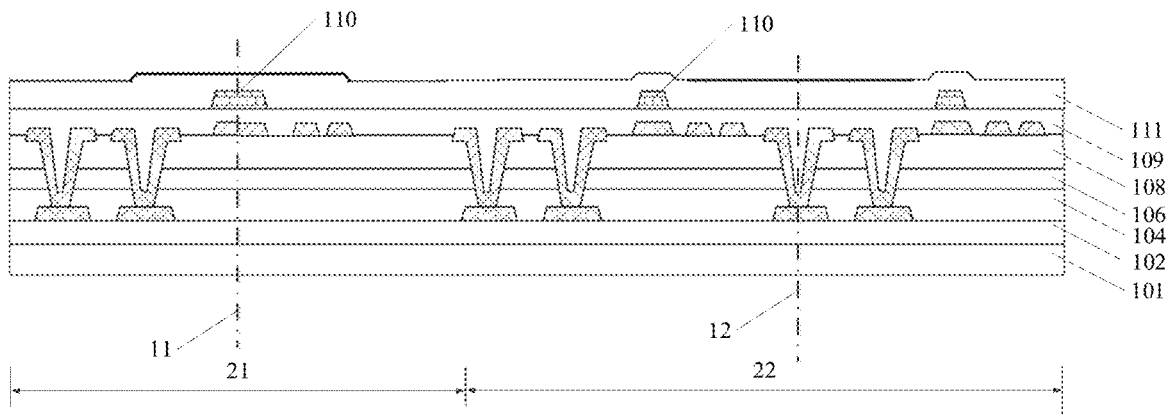

FIG. 14

DISPLAY PANEL AND DISPLAY DEVICE

This is a Continuation of U.S. patent application Ser. No. 17/788,794, filed Jun. 24, 2022, a National Phase Application filed under 35 U.S.C. 371 as a national stage of PCT/CN2021/115903 filed on Sep. 1, 2021, an application claiming the benefit of Chinese application No. 202011110228.8 filed on Oct. 16, 2020, the content of each of which is hereby incorporated by reference in its entirety.

TECHNICAL FIELD

The present disclosure generally relates to the field of display technologies, and more particularly, to a display panel and a display device including the display panel.

BACKGROUND

Organic light emitting diode (OLED) displays have become a research hotspot because of its advantages such as self illumination, high contrast, small thickness, wide viewing angle, fast response, flexibility and wide usage temperature range.

When organic light emitting diodes are used in a display panel, each organic light emitting diode generally includes a first electrode layer, a second electrode layer, and a light emitting layer sandwiched between the first electrode layer and the second electrode layer, and second electrode layers of light emitting diodes are fabricated as an entire surface electrode.

SUMMARY

The present disclosure aims to provide a display panel and a display device.

In a first aspect, there is provided a display panel having a display area and a peripheral area, the display panel includes:
  a base substrate, on which an active layer, a first insulating layer, a first gate layer, a second gate layer, a first metal layer and a second metal layer are stacked; and
  organic light emitting diode devices arranged on a side, away from the base substrate, of the first metal layer, where
  the first metal layer includes a second power signal line;
  the second metal layer includes an initialization voltage signal line, a first power signal line and a data signal line;
  the second power signal line and the second electrode layer are electrically connected with each other in the peripheral area;
  each of the organic light emitting diode devices includes a first electrode layer, a light emitting layer and a second electrode layer which are sequentially arranged on the base substrate;
  the second power signal line includes a plurality of traces in a first direction and a plurality of traces in a second direction, and orthographic projections of the traces in the first direction on the base substrate are intersected with orthographic projections of the traces in the second direction on the base substrate.

In some implementations, the traces in the first direction and the traces in the second direction are disposed in a same layer.

In some implementations, in the display area, the orthographic projections of the traces in the first direction on the base substrate are overlapped with an orthographic projection of the second metal layer on the base substrate.

In some implementations, in the display area, the orthographic projections of the traces in the first direction on the base substrate are overlapped with an orthographic projection of the initialization voltage signal line on the base substrate.

In some implementations, in the display area, the orthographic projections of the traces in the first direction on the base substrate are overlapped with an orthographic projection of the first power signal line on the base substrate.

In some implementations, in the display area, the orthographic projections of the traces in the first direction on the base substrate are overlapped with an orthographic projection of the data signal line on the base substrate.

In some implementations, in the display area, the orthographic projections of the traces in the second direction on the base substrate are overlapped with an orthographic projection of the second gate layer on the base substrate.

In some implementations, M sub-pixel units are provided between every two adjacent traces in the first direction;
  N sub-pixel units are provided between every two two adjacent traces in the second direction; and
  M and N are positive integers.

In some implementations, the traces in the first direction are disposed in a layer different from a layer where the traces in the second direction are disposed.

In a second aspect, there is provided a display device, which includes the display panel described above.

DRAWINGS

Other features, objects and advantages of the present disclosure will become more apparent by reading the detailed description of non-limiting embodiments made with reference to the following drawings:

FIG. 13 is an exemplary flow chart of a method for manufacturing a display panel according to another embodiment of the present disclosure;

FIGS. 14 to 18 are specific exemplary diagrams of methods for manufacturing the display panel in FIGS. 12 and 13.

DETAILED DESCRIPTION

Figure 1:
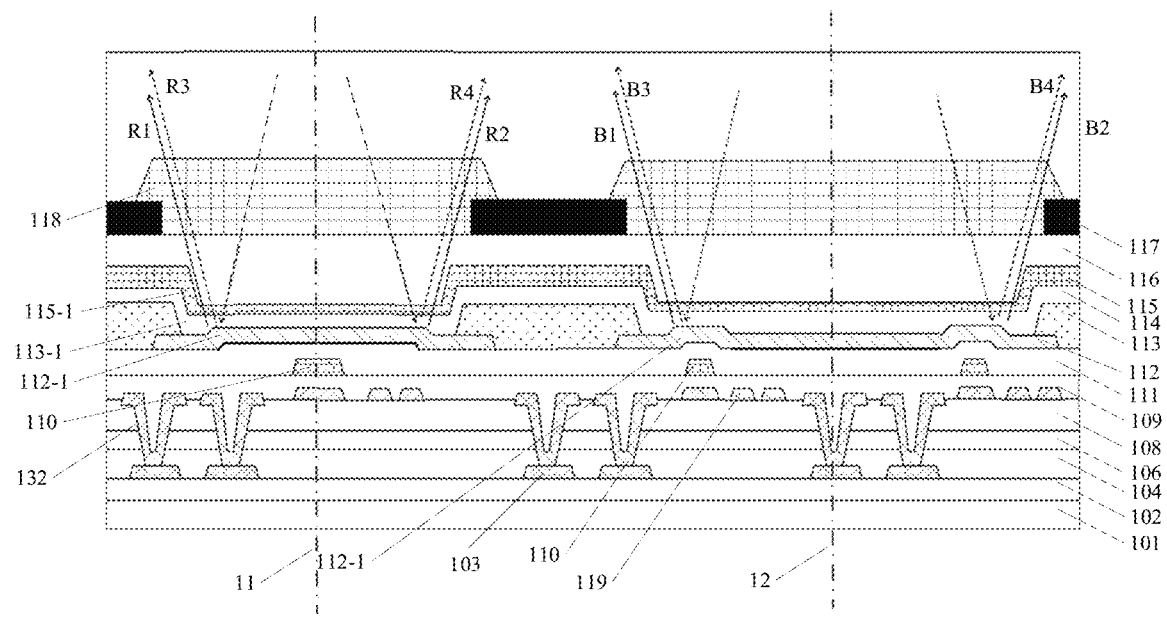
FIG. 1 is an exemplary structural diagram of a display panel according to an embodiment of the present disclosure.

The present application will be further described in detail below in combination with the accompanying drawings and embodiments. It is understandable that the specific embodiments described herein are only used to explain the related disclosure and not to limit the present disclosure. In addition, it should be noted that, for ease of description, only parts related to the present disclosure are shown in the drawings.

It is to be noted that, unless otherwise defined, technical terms or scientific terms used in the embodiments of the present disclosure should have a general meaning as understood by one having ordinary skill in the art to which the present disclosure belongs. The use of "first," "second," and the like in the present disclosure is not intended to indicate any order, quantity, or importance, but rather is used to distinguish one element from another. The word "include" or "comprise", and the like, means that the element or item preceding the word contains the element or item listed after the word and its equivalent, but does not exclude other elements or items. The terms "connect" or "couple" and the like are not restricted to physical or mechanical connections, but may include electrical connections, whether direct or indirect. Terms "on", "under", "left", "right", and the like are used only to indicate relative positional relationships, and when the absolute position of the object being described is changed, the relative positional relationships may be changed accordingly.

It should be noted that, in the present disclosure, the embodiments and features of the embodiments may be combined with each other without conflict. The present disclosure will be described in detail below with reference to the accompanying drawings in conjunction with the embodiments.

It is found that a conventional display panel has following problems: at present, an organic light emitting diode generally includes a first electrode layer, a second electrode layer and a light emitting layer sandwiched between the first electrode layer and the second electrode layer, the light emitting layer at least includes one hole transport layer, one light emitting layer and one electron transport layer. The the first electrode layer and the second electrode layer forms a semiconductor microcavity, which is an optical structure for narrowing spectrum, and photons generated in the light emitting layer are limited in the microcavity formed by the first electrode layer and the second electrode layer, which have mirror surfaces opposite to each other, so that light emitting characteristics of the organic light emitting diode not only depends on inherent characteristics of a material of the organic light emitting layer, but also has a certain correlation with shapes of the first electrode layer, the second electrode layer and the like. Improper design of the first electrode layer or the second electrode layer may cause color shift or color separation. For example, in a sub-pixel unit, if intensities of light emitted from portions of the light emitting layer are different, or intensities of light seen at a same viewing angle are different, the color shift may occur in an image seen by a viewer. In addition, after external light enters the display panel, the external light may be reflected by a part of a metal layer (for example, the first electrode layer or the second electrode layer) to form reflected light, and when intensities of the reflected light seen at a same viewing angle are different, the color separation may occur in the image seen by the viewer. Therefore, a proper structure of the display panel should be adopted, so that intensities of light emitted from the display panel at a same viewing angle are the same, and intensities of light reflected by the display panel at a same viewing angle are the same.

In order to solve the above technical problems, the present disclosure provides a display panel described below.

Referring to FIG. 1, a schematic structural diagram of the display panel is shown. The display panel includes a plurality of sub-pixel units, where each sub-pixel unit includes a first metal layer 110, a first planarization layer 111, a first electrode layer 112, a pixel defining layer 113, a light emitting layer 114 and a second electrode layer 115 which are sequentially stacked.

The first metal layer 110 includes one longitudinal trace 110-1 or a plurality of longitudinal traces 110-1 which are uniformly distributed side by side. The first metal layer 110, the first electrode layer 112, the pixel defining layer 113, and the second electrode layer 115 each are of an axisymmetric structure. When the number of the longitudinal traces 110-1 is odd, one of the longitudinal traces at a center position is taken as a symmetry axis 11 of the axisymmetric structure; when the number of the longitudinal traces 110-1 is even, a center line between two of the longitudinal traces 110-1 at outermost edges is taken as a symmetry axis 12 of the axisymmetric structure.

As shown in FIG. 1, the first planarization layer 111, the first electrode layer 112, the pixel defining layer 113, the light emitting layer 114 and the second electrode layer 115 are sequentially stacked on the first metal layer 110, where the first electrode layer 112 is formed with a protrusion 112-1 conformal with the first metal layer 110, so that a thickness of the light emitting layer 114 formed between the first electrode layer 112 and the second electrode layer 115 is not uniform, and further, intensities of light emitted by the light emitting layer 114 are not uniform, and intensities of reflected light generated by the first electrode layer 112 reflecting external light are also not uniform. Therefore, the first metal layer 110, the first electrode layer 112, the pixel defining layer 113 and the second electrode layer 115 are each configured to be of the axisymmetric structure, so that intensities of light emitted from portions of the light emitting layer on both sides of the symmetry axis are the same, for example, intensities of light R1 and light R2 emitted from positions with the same distances from the symmetry axis 11 are the same, intensities of light B1 and light B2 emitted from positions with the same distances from the symmetry axis 12 are the same, intensities of reflected light R3 and reflected light R4 reflected from positions with the same distances from the symmetry axis 11 are the same, and intensities of reflected light B3 and the reflected light B4 reflected from positions with the same distances from the symmetry axis 12 are the same. Conformal here means that, for two layers which are stacked, one of the layers changes with the other of the layers in shape. The first metal layer may transmit signals as required, for example, transmit power signals in a pixel driving circuit, which is not limited herein.

Figure 2:
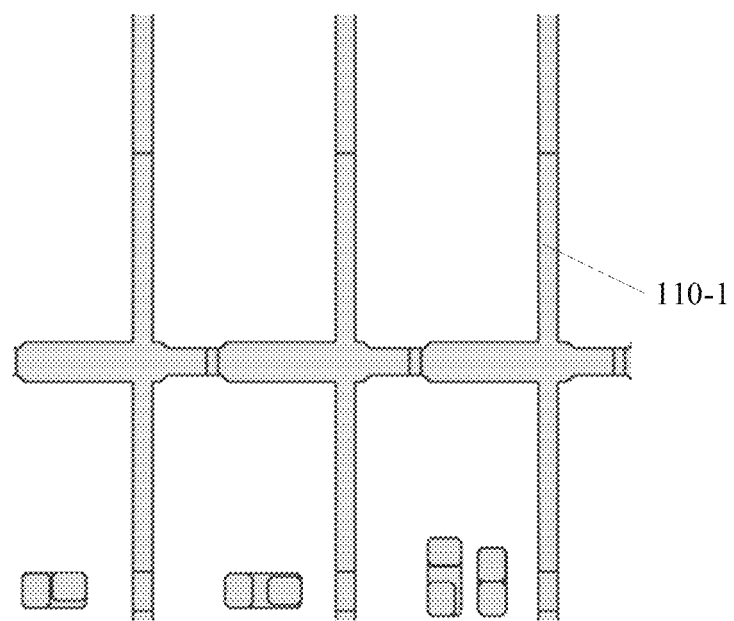
FIG. 2 is an exemplary top view of a first metal layer of FIG. 1.
Figure 3:
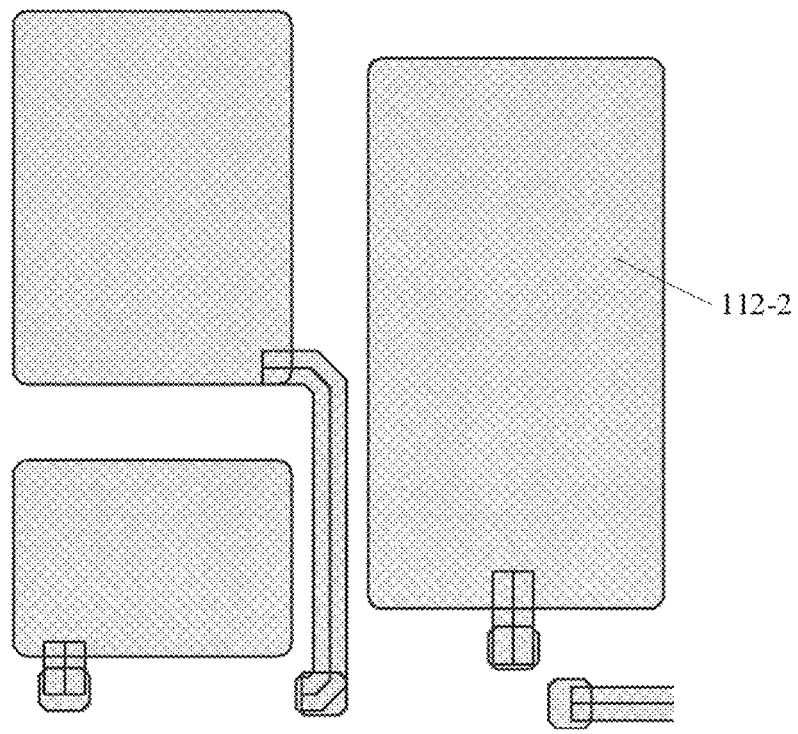
FIG. 3 is an exemplary top view of a first electrode layer of FIG. 1.
Figure 4:
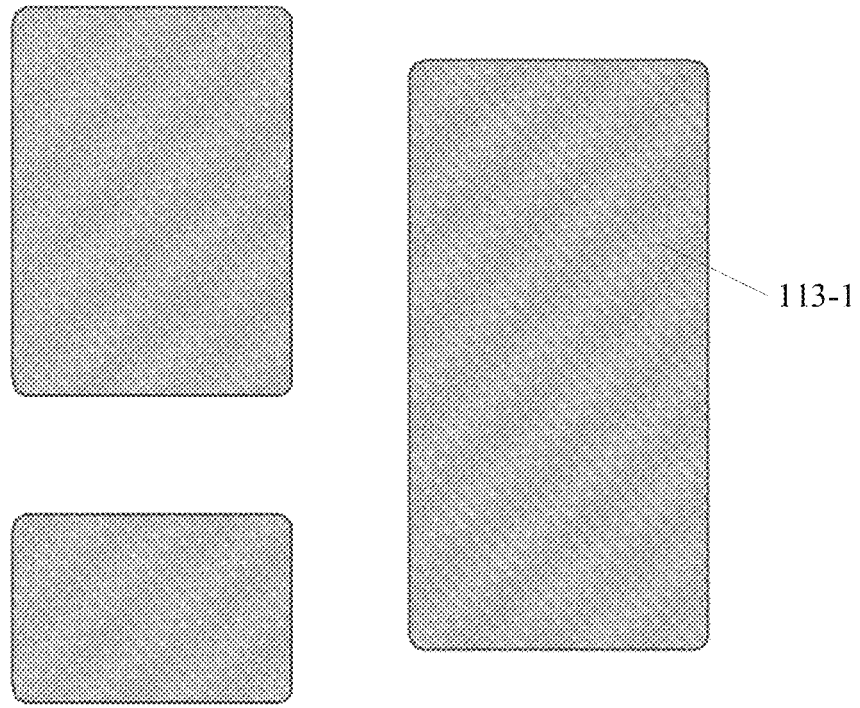
FIG. 4 is an exemplary top view of an pixel opening of FIG. 1.
Figure 5:
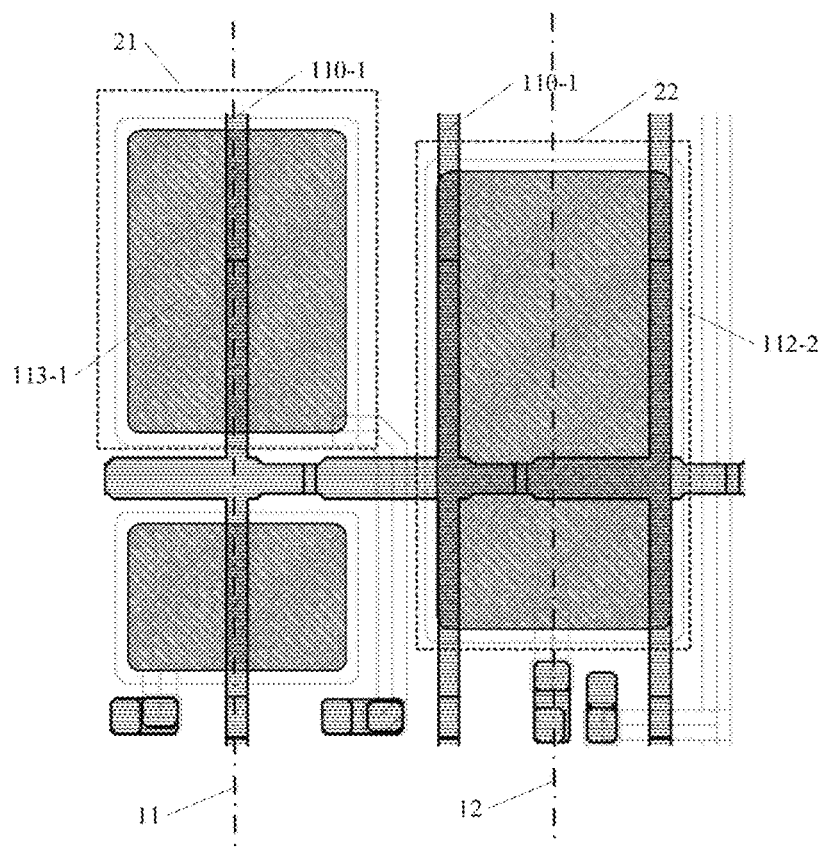
FIG. 5 is an exemplary top view illustrating that the first metal layer, the first electrode layer, and the pixel opening of FIG. 1 are stacked.

Referring to FIGS. 1 to 5, FIG. 2 is a schematic top view of the first metal layer of FIG. 1; FIG. 3 is an exemplary top view of the first electrode layer of FIG. 1; FIG. 4 is an exemplary top view of a pixel opening of FIG. 1; FIG. 5 is an exemplary top view illustrating that the first metal layer, the first electrode layer and the pixel opening of FIG. 1 are stacked.

In some implementations, the first metal layer 110 of the sub-pixel unit 21 is provided with one longitudinal trace 110-1; the first electrode layer 112 of the sub-pixel unit 21 includes a protrusion 112-1, and the protrusion 112-1 is of an axisymmetric structure with the longitudinal trace 110-1 serving as a symmetry axis.

It should be noted that, strictly speaking, the symmetry axis 11 should be understood to be a center line of the longitudinal trace 110-1. When ignoring a width of the longitudinal trace 110-1, the longitudinal trace 110-1 may be considered to be the symmetry axis, and such case is employed by the present disclosure for convenience of description.

In such case, the reflected light formed by the first electrode layer 112 reflecting external light is symmetrical with respect to the longitudinal trace 110-1 serving as a symmetry axis. For example, the reflected light R3 and the reflected light R4 from positions with the same distances from the longitudinal trace 110-1 have the same exiting angles and the same intensities, and thus occurrence of color separation is prevented.

In some implementations, the pixel defining layer 113 of the sub-pixel unit 21 includes a pixel opening 113-1, and the pixel opening 113-1 is of an axisymmetric structure with the longitudinal trace 110-1 serving as a symmetry axis.

The second electrode layer 115 of the sub-pixel unit 21 includes a recess 115-1, and the recess 115-1 is of an axisymmetric structure with the longitudinal trace 110-1 serving as a symmetry axis.

A case where each sub-pixel unit includes one longitudinal trace is shown in the embodiment, and in such case, the protrusion 112-1, the recess 115-1, and the pixel opening 113-1 each are symmetrical with respect to the longitudinal trace 110-1 serving as a symmetry axis, so that the light emitting layer 114 between the first electrode layer 112 and the second electrode layer 115 is also symmetrical with respect to the longitudinal trace 110-1 serving as a symmetry axis. In such case, the light emitting layer symmetrical with respect to the longitudinal trace 110-1 is formed in the sub-pixel unit 21. Therefore, intensities of light emitted from the light emitting layer are also symmetrical with respect to the longitudinal trace 110-1 serving as the symmetry axis, for example, exiting light R1 and exiting light R2 from positions having the same distances from the longitudinal trace 110-1 have the same exiting angles and the same intensities, and thus occurrence of color shift is prevented.

As shown in FIGS. 1 and 5, in some implementations, an orthographic projection of the pixel opening 113-1 on the first metal layer of the sub-pixel unit 21 covers the longitudinal trace 110-1. FIGS. 2, 3 and 4 show top views of the first metal layer 110, the first electrode layer 112 and the pixel opening 113-1, respectively, and FIG. 5 is an exemplary top view illustrating that the first metal layer, the first electrode layer, and the pixel opening are stacked. As shown in FIG. 2, the first metal layer is provided with longitudinal traces 110-1 uniformly arranged side by side, as shown in FIG. 3, the first electrode layer is provided with a first electrode block 112-2, as shown in FIG. 4, the pixel defining layer is provided with the pixel opening 113-1, as shown in FIG. 5, the pixel opening 113-1 and the first electrode block 112-2 of the sub-pixel unit 21 each are of a symmetrical structure with the longitudinal trace 110-1 serving as a symmetry axis, and an orthographic projection of the pixel opening 113-1 of the sub-pixel unit 21 on the first metal layer covers the longitudinal trace 110-1.

Referring to FIG. 1 to FIG. 5, in some implementations, the first metal layer 110 of the sub-pixel unit 22 is provided with two longitudinal traces; the first electrode layer 112 of the sub-pixel unit 22 includes two protrusions 112-1, and the protrusions 112-1 are respectively located right above the longitudinal traces 110.

A case where each sub-pixel unit includes two longitudinal traces is shown in the embodiment, in such case, the reflected light formed by the first electrode layer reflecting the external light is symmetrical with respect to the symmetry axis 12. For example, the reflected light R3 and the reflected light R4 reflected at the positions having the same distances from the symmetry axis 12 have the same exiting angles and the same intensities, and thus occurrence of color separation is prevented.

In some implementations, the pixel defining layer 113 of each sub-pixel unit 22 includes a pixel opening 113-1, and the pixel opening 113-1 is of an axisymmetric structure with a central line, between two longitudinal traces, serving as a symmetry axis. The second electrode layer 115 of the sub-pixel unit 22 includes a recess 115-1, and the recess 115-1 is of an axisymmetric structure with the central line, between the two longitudinal traces, serving as the symmetry axis.

In such case, the protrusion 112-1, the recess 115-1, and the pixel opening 113-1 each are symmetric with respect to the symmetry axis 12, so that the light emitting layer 114 between the first electrode layer 112 and the second electrode layer 115 is also symmetric with respect to the symmetry axis 12. In such case, the light emitting layer formed in the sub-pixel unit 22 is symmetric with respect to the symmetry axis 12. Therefore, the intensities of the light emitted from the light emitting layer 114 are symmetric with respect to the symmetry axis 12, for example, the exiting light B1 and the exiting light B2 emitted from the positions with the same distances from the symmetry axis 12 have the same exiting angles and the same intensities, and thus occurrence of color shift is prevented.

As shown in FIGS. 1 and 5, in some implementations, an orthographic projection of the pixel opening 113-1 on the first metal layer of the sub-pixel unit 22 covers the two longitudinal traces 110-1. FIGS. 2, 3 and 4 show top views of the first metal layer 110, the first electrode layer 112 and the pixel opening 113-1, respectively, and FIG. 5 is an exemplary top view illustrating that the first metal layer, the first electrode layer, and the pixel opening are stacked. As shown in FIG. 2, the first metal layer is provided with the longitudinal traces 110-1 uniformly arranged side by side, as shown in FIG. 3, the first electrode layer is provided with a first electrode block 112-2, as shown in FIG. 4, the pixel defining layer is provided with a pixel opening 113-1, as shown in FIG. 5, the pixel opening 113-1 and the first electrode block 112-2 of the sub-pixel unit 22 are each of a symmetrical structure with a central line between the longitudinal traces 110-1 serving as the symmetry axis 12, and an orthographic projection of the pixel opening 113-1 of the sub-pixel unit 22 on the first metal layer covers the two longitudinal traces 110-1.

It should be noted that each sub-pixel unit of the display panel may include one longitudinal trace, or each sub-pixel unit includes two longitudinal traces, or each of a part of sub-pixel units includes one longitudinal trace and each of another part of sub-pixel units includes two longitudinal traces. The above configuration is not limited, but may be adjusted according to an application scenario.

In addition, each sub-pixel unit may include a plurality of longitudinal traces, and the symmetry axis may be determined according to the number of the longitudinal traces. When the number of the longitudinal traces is odd, one of the longitudinal traces at the central position is taken as the symmetry axis of the symmetrical structure, for example, when the number of the longitudinal traces is three, one of the longitudinal traces at the central position is taken as the symmetry axis; when the number of the longitudinal traces is even, a central line between two longitudinal traces at the outermost edges is taken as the symmetry axis of the symmetric structure, for example, when the number of the longitudinal traces is 2, the central line between the two longitudinal traces is taken as the symmetry axis.

A specific example of the display panel is given below with reference to FIGS. 1 to 5. The sub-pixel unit 21 includes one longitudinal trace, and the sub-pixel unit 22 includes two longitudinal traces. The display panel includes a base substrate 101, a buffer layer 102, a backplane, light emitting devices, an encapsulation layer 116, a black matrix 117 and color filters 118 which are sequentially stacked. The backplane includes an active layer 103, a first insulating layer 104, a first gate layer (not shown, located between the first insulating layer 104 and a second insulating layer 106), the second insulating layer 106, a second gate layer (not shown, located between the second insulating layer 106 and a dielectric layer 108), the dielectric layer 108, a second metal layer 119, a second planarization layer 109, a first metal layer 110, and a first planarization layer 111, which are sequentially stacked. Each light emitting device includes a first electrode layer 112, a pixel defining layer 113, a light emitting layer 114, and a second electrode layer 115, which are sequentially stacked. The second metal layer 119 is connected to the active layer 103 through a via hole 132.

In addition, the first electrode layer 112, the pixel defining layer 113, the light emitting layer 114 and the second electrode layer 115 of the sub-pixel unit 21 are configured into symmetrical structures with the longitudinal trace 110-1 serving as a symmetry axis. The first electrode layer 112, the pixel defining layer 113, the light emitting layer 114, and the second electrode layer 115 of the sub-pixel unit 22 are configured into symmetrical structures with a central line between the longitudinal traces 110-1 serving as a symmetry axis 12. In such case, the display panel does not have the problems of color shift and color separation.

Figure 6:
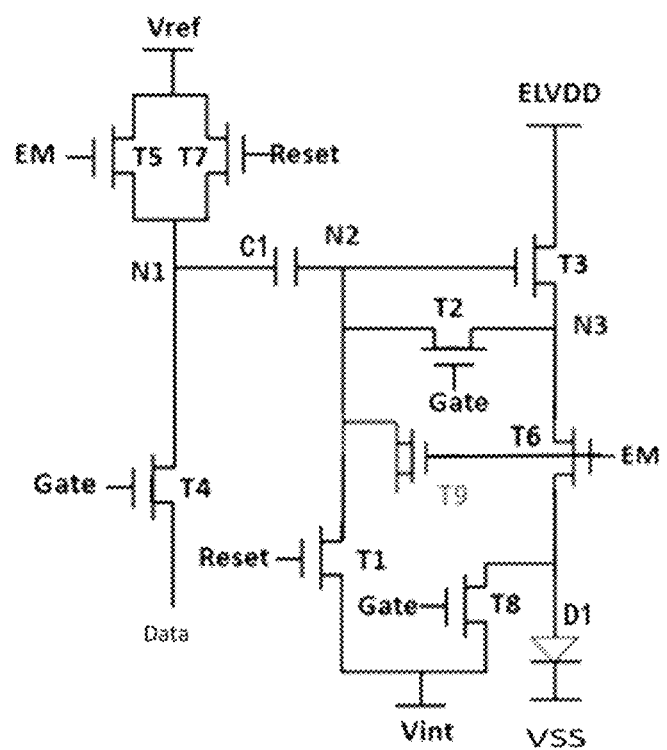
FIG. 6 is an exemplary schematic diagram of a pixel driving circuit of the display panel of FIG. 1.

FIG. 6 is an exemplary schematic diagram of a pixel driving circuit of the display panel of FIG. 1. The pixel driving circuit employs a 9T1C structure (i.e., including nine transistors and one capacitor) adopting an Active Matrix (AM) type organic light emitting driving mode. As shown in FIG. 1, the pixel driving circuit includes a plurality of signal lines, a plurality of thin film transistors (TFTs) connected to the signal lines, an energy storage capacitor C1, and an organic light emitting diode D1. The signal lines may be shared by a plurality of sub-pixels.

The plurality of TFTs include: a driving transistor T3, a first reset transistor T1, a second reset transistor T7, a data writing transistor T4, a first light emission control transistor T5, a second light emission control transistor T6, a second compensation transistor T9, an initialization transistor T8, and a first compensation transistor T2.

The plurality of signal lines include: a reset signal line 201 for transmitting a reset signal Reset; a gate signal line 202 for transmitting a gate signal Gate; a data signal line 208 for transmitting a data signal Data; a light emission control signal line 203 for transmitting a light emission control signal EM; an initialization voltage signal line 207 for transmitting an initialization voltage signal Vint, a reference voltage signal line 204 for transmitting a reference voltage signal Vref, and a power line including a first power signal line 205 for transmitting a first power signal ELVDD and a second power signal line 206 for transmitting a second power signal VSS.

The driving transistor T3 includes: a gate connected to a second electrode of the energy storage capacitor C1, i.e., connected to a second node N2; a first electrode for receiving the first power signal ELVDD; and a second electrode connected to a second electrode of the first compensation transistor T2, i.e., connected to a third node N3.

The first reset transistor T1 includes: a gate for receiving the reset signal Reset; a first electrode connected to the second electrode of the energy storage capacitor C1, i.e., connected to the second node N2; and a second electrode for receiving the initialization power signal Vint.

The second reset transistor T7 includes: a gate for receiving the reset signal Reset; a first electrode for receiving the reference voltage signal Vref; and a second electrode connected to a first electrode of the energy storage capacitor, i.e., connected to a first node N1.

The data writing transistor T4 includes: a gate for receiving the gate signal Gata; a first electrode connected to the first node N1; and a second electrode for receiving the data signal Data.

The first light emission control transistor T5 includes: a gate for receiving the light emission control signal EM; a first electrode for receiving the reference voltage signal Vref; and a second electrode connected to the first node N1.

The first light emission control transistor T6 includes: a gate for receiving the light emission control signal EM; a first electrode connected to the third node N3; and a second electrode connected to the first electrode layer of the light emitting diode D1.

The second compensation transistor T9 includes: a gate for receiving the light emission control signal EM; a first electrode and a second electrode connected to each other and connected to the second node N2. In practice, the second compensation transistor T9 may be regarded as a compensation capacitor for compensating a voltage at the second node N2.

The initialization transistor T8 includes: a gate for receiving the gate signal Gate; a first electrode connected to the first electrode layer of the light emitting diode D1; and a second electrode for receiving the initialization signal Vint.

Figure 7:
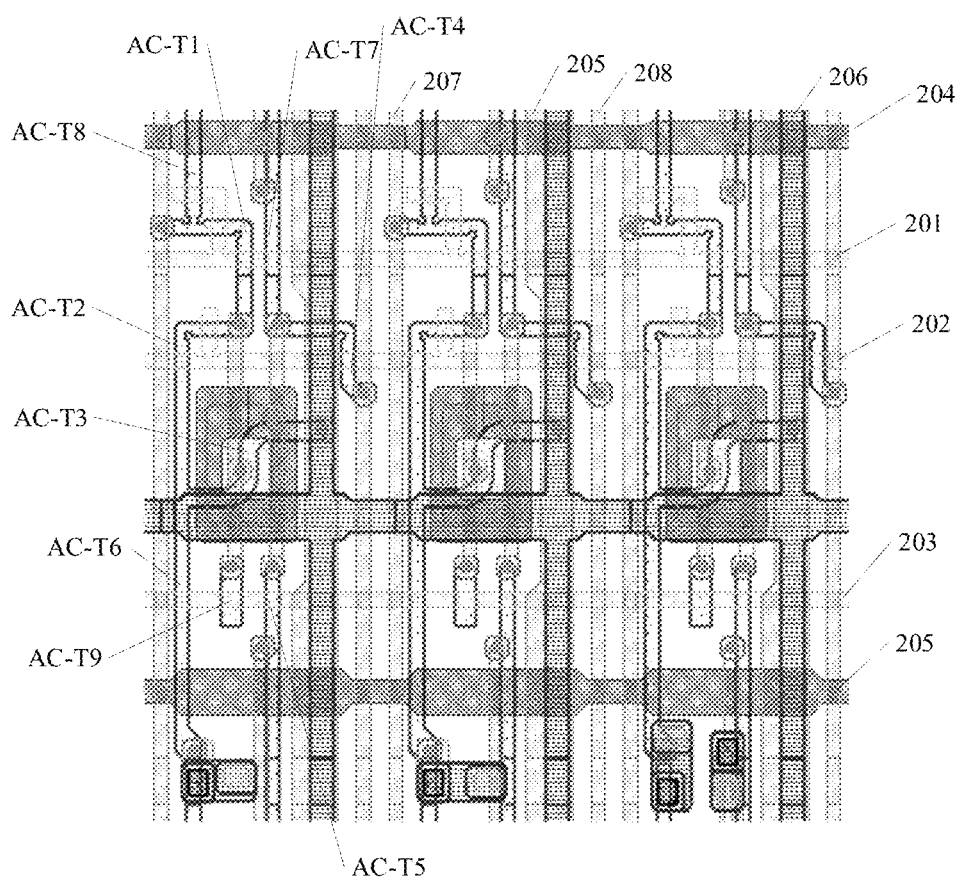
FIG. 7 is an exemplary schematic diagram illustrating a layout of a TFT and a capacitor of a sub-pixel.
Figure 8:
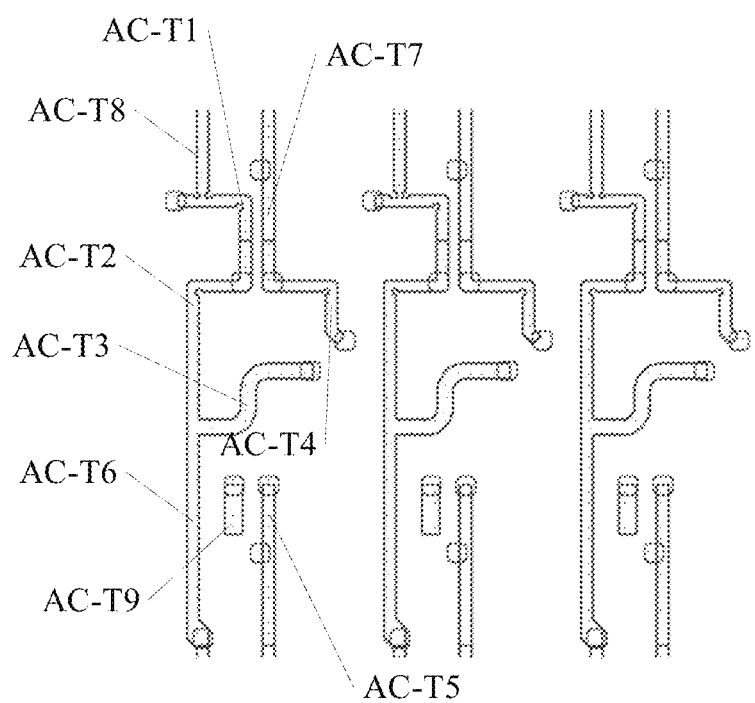
FIGS. 8 to 11 are plan views of various layers in the layout of FIG. 7.
Figure 9:
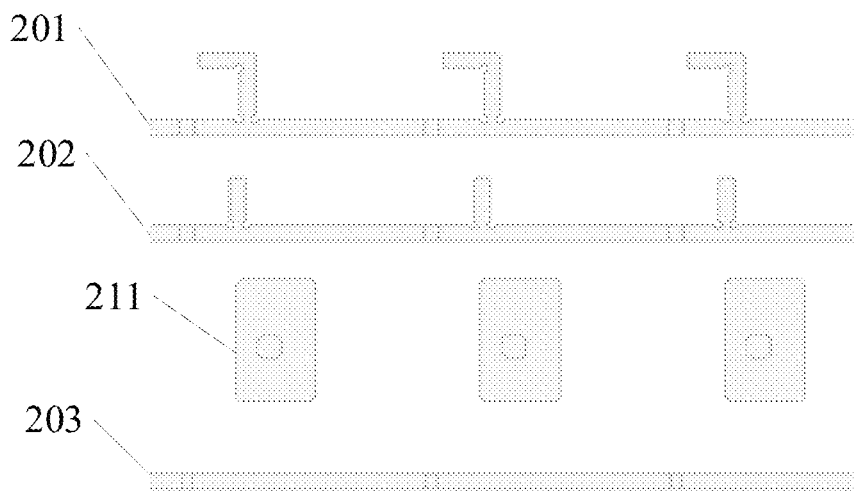
Figure 10:
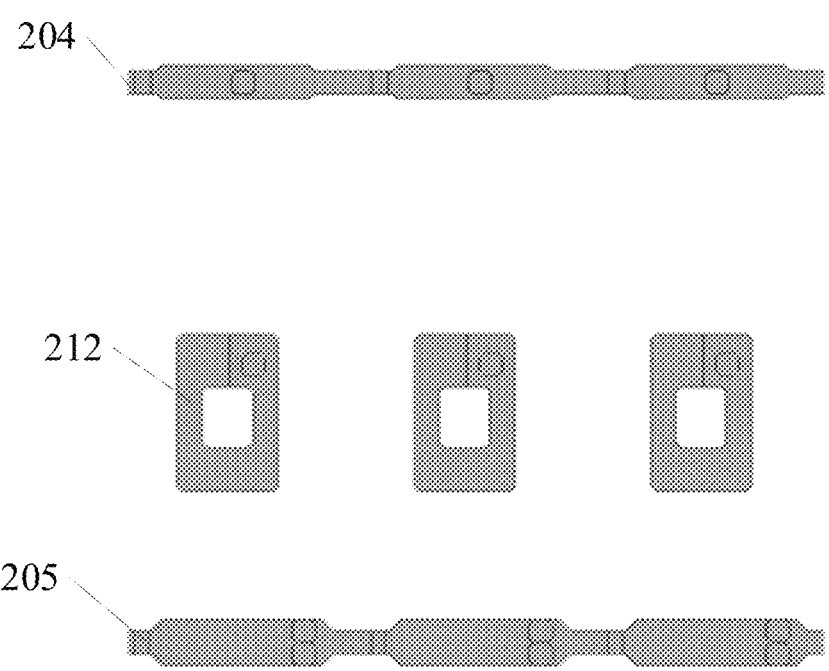
Figure 11:
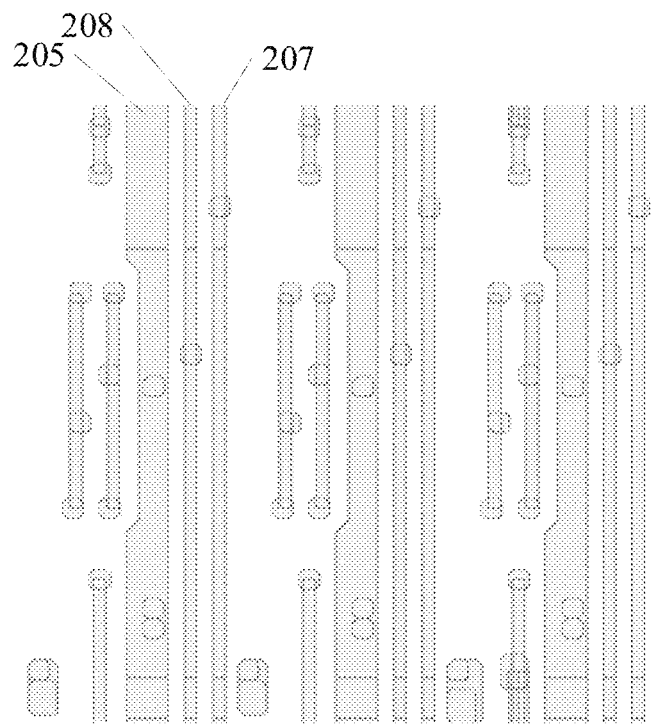

FIG. 7 is an exemplary schematic diagram illustrating a layout of a TFT and a capacitor of the sub-pixel; FIGS. 8 to 11 are plan views of various layers in the layout of FIG. 7. Specifically, FIGS. 8 to 11 show an implementation of wirings in a same layer or an arrangement of a semiconductor layer, where FIG. 8 is a plan view of the active layer 203, FIG. 9 is a plan view of the first gate layer, FIG. 10 is a plan view of the second gate layer, and FIG. 11 is a plan view of the second metal layer 119. In addition, FIG. 7 further includes a plan view of the first metal layer 110 of FIG. 2. The first gate layer is located between the first insulating layer 104 and the second insulating layer 106; the second gate layer is located between the second insulating layer 106 and the dielectric layer 108. FIG. 1 is a cross-sectional view of the structure of FIG. 7 taken along line AA'.

FIGS. 7 to 11 show the reset signal line 201 for transmitting the reset signal Reset, the gate signal line 202 for transmitting the gate signal Gate, the light emission control signal line 203 for transmitting the light emission control signal EM, the reference voltage signal line 204 for transmitting the reference voltage signal Vref, and the first power signal line 205 for transmitting a high level signal (the first power signal), which are arranged in a row direction. The reset signal line 201, the gate signal line 202, and the light emission control signal line 203 are provided in the first gate layer, and the reference voltage signal line 204 and the first power signal line 205 are provided in the second gate layer.

In FIGS. 7 to 11, the initialization voltage signal line 207 for transmitting the initialization voltage signal Vint, the data signal line 208 for transmitting the data signal Data, the first power signal line 205 for transmitting the first power signal ELVDD and the second power signal line 206 for transmitting a low level signal (i.e., the second power signal VSS), which are arranged in a column direction, are further shown. The initialization voltage signal line 207, the data signal line 208, and the first power signal line 205 are provided in the second metal layer 119, and the second power signal line 206 is provided in the first metal layer 110.

As shown in FIG. 8, the driving transistor T3, the first reset transistor T1, the second reset transistor T7, the data writing transistor T4, the first light emission control transistor T5, the second light emission control transistor T6, the second compensation transistor T9, the initialization transistor T8 and the first compensation transistor T2 may be formed along the active layer in FIG. 8. The active layer has a curved or bent shape and includes an active layer AC-T8 of the initialization transistor T8, an active layer AC-T1 of the first reset transistor T1, an active layer AC-T2 of the first compensation transistor T2, an active layer AC-T3 of the driving transistor T3, an active layer AC-T6 of the second light emission control transistor T6, an active layer AC-T7 of the second reset transistor T7, an active layer AC-T4 of the data writing transistor T4, an active layer AC-T9 of the second compensation transistor T9, and an active layer AC-T5 of the first light emission control transistor T5.

The active layer may include a polysilicon material and include a channel region, a source region, and a drain region. The channel region may not be doped with impurities and thus has semiconductor characteristics. The source region and the drain region are on both sides of the channel region respectively and are doped with impurities, and thus have conductivity. The impurities may be selected depending on whether the transistor is of a P-type or N-type. The source region and the drain region may be regarded as the first electrode and the second electrode of the transistor.

The energy storage capacitor includes a first energy storage capacitor plate 211 and a second energy storage capacitor plate 212, which are respectively located in the first gate layer and the second gate layer. The first energy storage capacitor plate 211 may be used as the gate of the driving transistor T3, and the second energy storage capacitor plate 212 may be used as the first electrode or the second electrode of the second compensation transistor.

Figure 19:
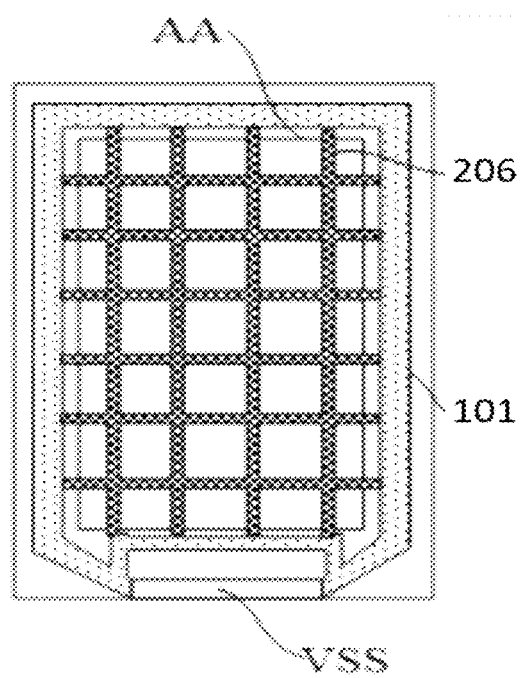
FIG. 19 is an overall exemplary schematic diagram of a second power signal line and the display panel.

As shown in FIG. 19, the display panel includes a display area AA and a peripheral area surrounding the display area. In the display panel, the second electrode layer 115 is usually made of Mg/Ag with a relatively large resistance, which may cause a relatively large voltage drop (IR Drop) on the second electrode layer 115, and further may cause an increase in driving power consumption, in order to solve the above problem, the second power signal line 206 is prepared in the first metal layer, and is connected to the second electrode layer 115 in the peripheral area, which is equivalent to connecting the second power signal line 206 with the second electrode layer 115 in parallel, so that the resistance of the second electrode layer 115 can be reduced, thereby reducing the voltage drop of the second power signal, and further reducing the driving power consumption of the display panel. The second power signal line 206 includes a plurality of traces in a first direction and a plurality of traces in a second direction, orthographic projections of the traces in the first direction on the base substrate 101 are intersected with orthographic projections of the traces in the second direction on the base substrate 101, that is, the second power signal line 206 is in a grid shape, so as to reduce the driving power consumption of the display panel better, where the first direction is a direction in which the data signal line extends, for example, is a longitudinal (column) direction; the second direction is a direction in which the gate signal line extends, for example, is a horizontal (row) direction.

In some implementations, in order to reduce a thickness of the display panel and achieve lightness and thinness of the display panel, the traces in the first direction of the second power signal line 206 and the traces in the second direction of the second power signal line 206 are disposed in a same layer, and the traces in the first direction and the traces in the second direction of the second power signal line 206 being disposed in the same layer may be made of a same material or different materials.

In some implementations, in order to reduce influence of the second power signal line 206 on light transmission of the display area, in the display area, orthographic projections of the traces in the first direction of the second power signal line 206 on the base substrate 101 are overlapped with an orthographic projection of the second metal layer on the base substrate 101, so as to reduce the influence of the traces in the first direction on the light transmission of the display area.

In some implementations, in the display area, the orthographic projections of the traces in the first direction of the second power signal line 206 on the base substrate 101 are overlapped with an orthographic projection of the initialization voltage signal line 207 on the base substrate 101, so as to reduce the influence of the traces in the first direction on the light transmission of the display area.

In some implementations, in the display area, the orthographic projections of the traces in the first direction of the second power signal line 206 on the base substrate 101 are overlapped with an orthographic projection of the first power signal line 205 on the base substrate 101, so as to reduce the influence of the traces in the first direction on the light transmission of the display area.

In some implementations, in the display area, the orthographic projections of the traces in the first direction of the second power signal line 206 on the base substrate 101 are overlapped with an orthographic projection of the data signal line 208 on the base substrate 101, so as to reduce the influence of the traces in the first direction on the light transmission of the display area.

In some implementations, in the display area, the orthographic projections of the traces in the second direction of the second power signal line 206 on the base substrate are overlapped with an orthographic projection of the second gate layer on the base substrate, so as to reduce the influence of the traces in the second direction on the light transmission of the display area, where, the orthographic projections of the traces in the second direction of the second power signal line 206 on the base substrate 101 may be overlapped with an orthographic projection of the reference voltage signal line 204 in the second gate layer on the base substrate 101 or an orthographic projection of the first power signal line 205 in the second gate layer on the base substrate 101, and in order to avoid generating interlayer capacitance to affect load on the signal line, it is desirable that the orthographic projections of the traces in the second direction of the second power signal line 206 on the base substrate 101 are overlapped with an orthographic projection of the second energy storage capacitor plate 212 in the second gate layer on the base substrate 101.

In some implementations, M sub-pixel units are provided between every two adjacent trances in the first direction, N sub-pixel units are provided between every two adjacent traces in the second direction, where M and N are positive integers and are selected according to actual process conditions.

In some implementations, the traces in the first direction of the second power signal line 206 are disposed in a layer different from a layer where the traces in the second direction of the second power signal line 206 are disposed, so as to reduce the process difficulty and save the process cost, that is, the traces in the first direction of the second power signal line 206 and the traces in the second direction of the second power signal line 206 are formed of different film layers.

The present disclosure further provides a display device, which includes the display panel described above.

Figure 12:
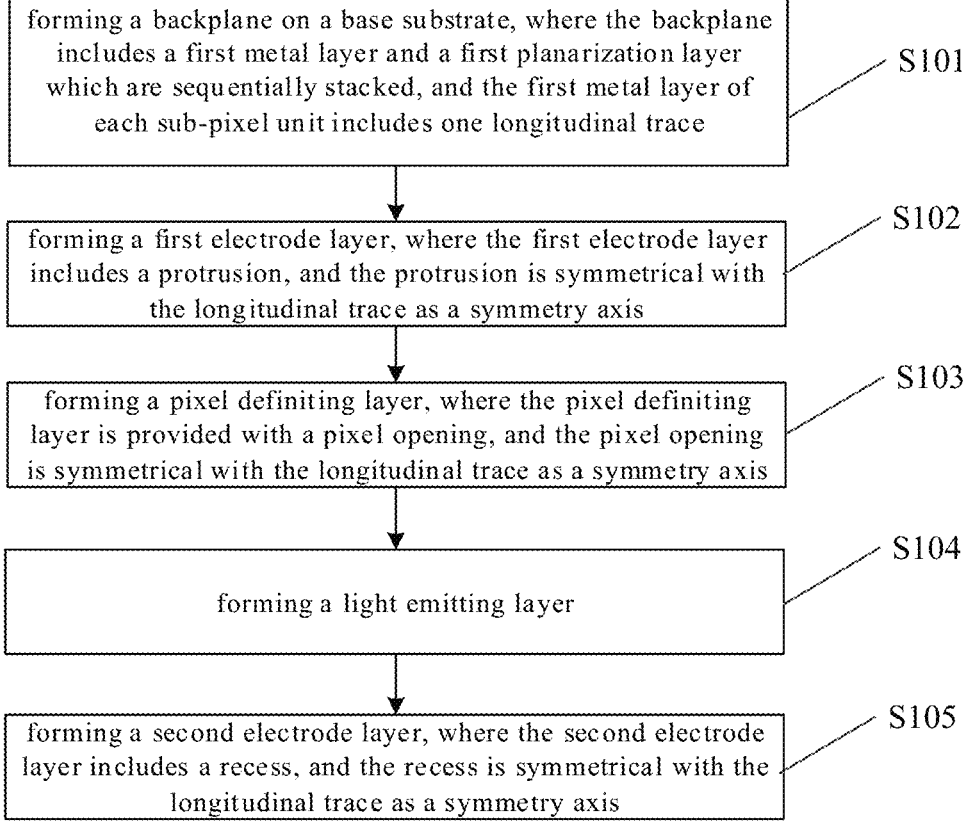
FIG. 12 is an exemplary flow chart of a method for manufacturing a display panel according to an embodiment of the present disclosure.

The present disclosure further provides a method for manufacturing a display panel. As shown in FIG. 12, the method includes following steps S101 to S105:
- step S101, forming a backplane on a base substrate, where the backplane includes a first metal layer and a first planarization layer which are sequentially stacked, and the first metal layer of each sub-pixel unit includes one longitudinal trace;
- step S102, forming a first electrode layer, where the first electrode layer includes a protrusion, and the protrusion is symmetrical with respect to the longitudinal trace serving as a symmetry axis;
- step S103, forming a pixel defining layer, where the pixel defining layer is provided with a pixel opening, and the pixel opening is symmetrical with respect to the longitudinal trace serving as a symmetry axis;
- step S104, forming a light emitting layer; and
- step S105, forming a second electrode layer, where the second electrode layer includes a recess, and the recess is symmetrical with respect to the longitudinal trace serving as a symmetry axis.

The above-described method is explained below with reference to FIGS. 14 to 18. In these figures, a sub-pixel unit 21 and a sub-pixel unit 22 are shown, and the sub-pixel unit 21 will be taken as an example for explanation below.

As shown in FIG. 14, the backplane is formed on the base substrate 101, the backplane includes the first metal layer 110 and the first planarization layer 111, which are sequentially stacked, and the first metal layer 110 of the sub-pixel unit 21 includes one longitudinal trace 110-1. The backplane includes an active layer 103, a first insulating layer 104, a first gate layer (not shown, located between the first insulating layer 104 and a second insulating layer 106), the second insulating layer 106, a second gate layer (not shown, located between the second insulating layer 106 and a dielectric layer 108), the dielectric layer 108, a second planarization layer 109, a first metal layer 110 and a first planarization layer 111, which are sequentially stacked.

Figure 15:
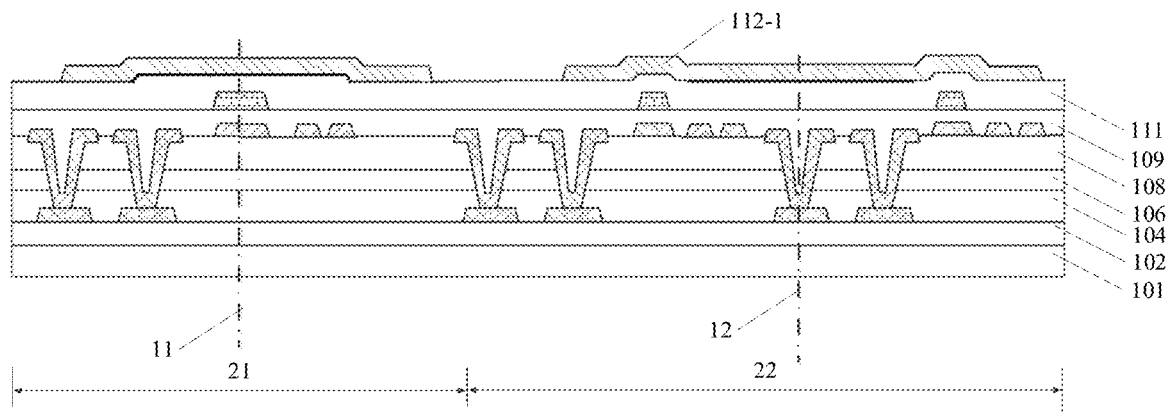

As shown in FIG. 15, the first electrode layer 112 is formed on the first planarization layer 111 of FIG. 14, the first electrode layer includes a protrusion 112-1, and the protrusion 112-1 is symmetrical with respect to the longitudinal trace saving as a symmetry axis.

Figure 16:
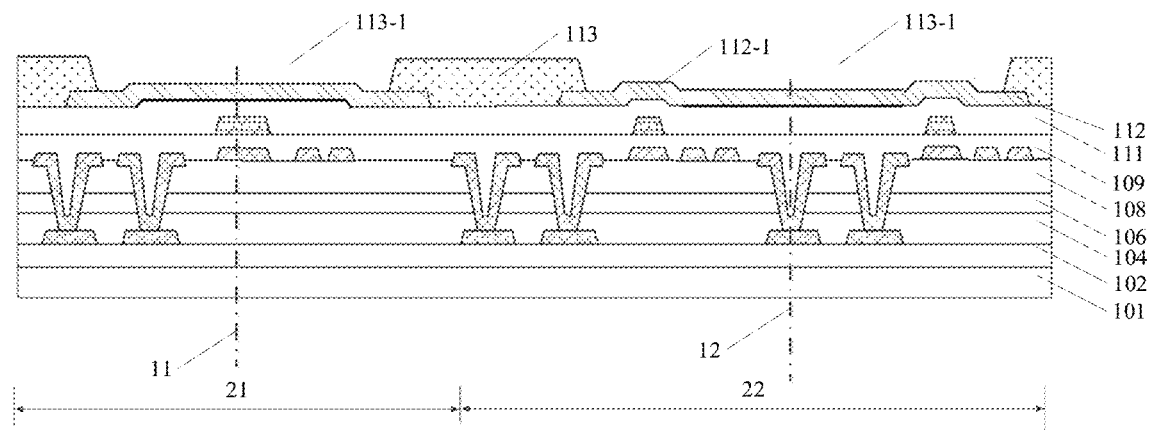

As shown in FIG. 16, the pixel defining layer 113 is formed on the first electrode layer 112 of FIG. 15, and the pixel defining layer 113 is provided with a pixel opening 113-1, which is symmetrical with respect to the longitudinal trace serving as a symmetry axis.

Figure 17:
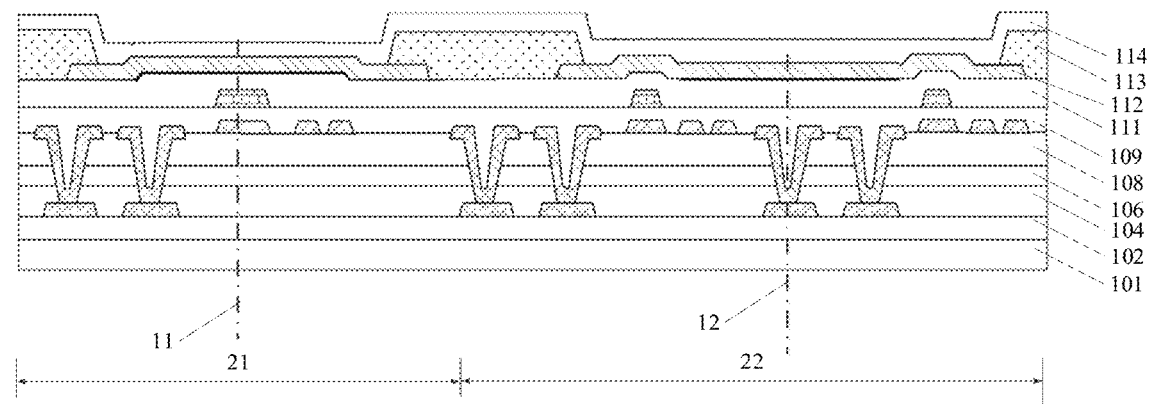

As shown in FIG. 17, the light emitting layer 114 is formed on the pixel defining layer 113 of FIG. 16, and the light emitting layer of the sub-pixel unit 21 has a symmetrical structure with the longitudinal trace serving as a symmetry axis.

Figure 18:
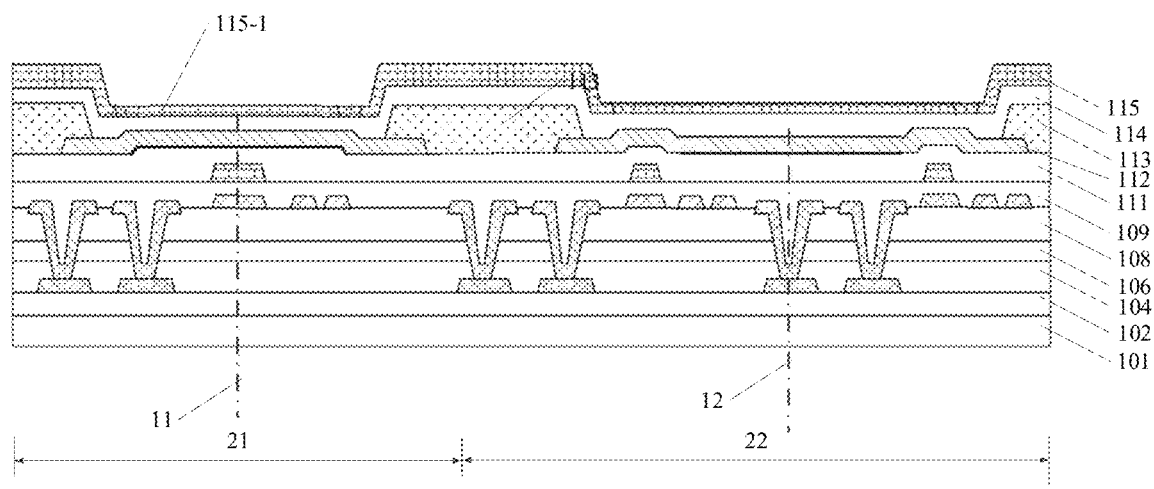

As shown in FIG. 18, the second electrode layer 115 is formed on the light emitting layer 114 of FIG. 17, and the second electrode layer 115 includes a recess 115-1, which is symmetrical with respect to the longitudinal trace serving as a symmetry axis.

An encapsulation layer 116, a black matrix 117, and color filters 118 are sequentially formed on the second electrode layer 115, and then the display panel shown in FIG. 1 is formed.

The methods for forming the layers may adopt existing process methods, and are not described herein.

The present disclosure further provides a method for manufacturing a display panel. As shown in FIG. 13, the method includes following steps S201 to S205:
- step S201, forming a backplane on a base substrate, where the backplane includes a first metal layer and a first planarization layer which are sequentially stacked, and the first metal layer of each sub-pixel unit includes two longitudinal traces;
- step S202: forming a first electrode layer, where the first electrode layer includes two protrusions which are respectively positioned right above the longitudinal traces;
- step S203: forming a pixel defining layer, where the pixel defining layer is provided with a pixel opening, and the pixel opening is symmetrical with respect to a central line, between the two longitudinal traces, serving as a symmetry axis;
- step S204: forming a light emitting layer; and
- step S205: forming a second electrode layer, where the second electrode layer includes a recess, and the recess is symmetrical with respect to the central line, between the two longitudinal traces, serving as a symmetry axis.

The above-described manufacturing process will be explained below with reference to FIGS. 14 to 18. In the figures, a sub-pixel unit 21 and a sub-pixel unit 22 are shown, and the sub-pixel unit 22 is taken as an example for explanation below.

As shown in FIG. 18, the backplane is formed on the base substrate, the backplane includes the first metal layer 110 and the first planarization layer 111 which are sequentially stacked, and the first metal layer 110 of each sub-pixel unit 22 includes two longitudinal traces 110-1. The backplane includes an active layer 103, a first insulating layer 104, a first gate layer (not shown, located between the first insulating layer 104 and a second insulating layer 106), the second insulating layer 106, a second gate layer (not shown, located between the second insulating layer 106 and a dielectric layer 108), the dielectric layer 108, a second planarization layer 109, the first metal layer 110, and a first planarization layer 111, which are sequentially stacked.

As shown in FIG. 15, the first electrode layer 112 is formed on the first planarization layer 111 of FIG. 14, and the first electrode layer includes two protrusions 112-1, where the two protrusions 112-1 are symmetrical with respect to the central line, between the two longitudinal traces, serving as a symmetry axis 12.

As shown in FIG. 16, the pixel defining layer 113 is formed on the first electrode layer 112 of FIG. 15, and the pixel defining layer 113 is provided with a pixel opening 113-1 which is symmetrical with respect to the center line, between the two longitudinal traces, serving as a symmetry axis 12.

As shown in FIG. 17, the light emitting layer 114 is formed on the pixel defining layer 113 of FIG. 16, and the light emitting layer of the sub-pixel unit 21 is of a symmetrical structure with the central line, between the two longitudinal traces, serving as a symmetry axis 12.

As shown in FIG. 18, the second electrode layer 115 is formed on the light emitting layer 114 of FIG. 17, and the second electrode layer 115 includes a recess 115-1 which is symmetrical with respect to the center line, between the two longitudinal traces, serving as a symmetry axis 12.

An encapsulation layer 116, a black matrix 117 and color filters 118 are sequentially formed on the second electrode layer 115, and then the display panel shown in FIG. 1 is formed.

It should be noted that each sub-pixel unit of the display panel may adopt a structure including one longitudinal trace, or adopt a structure including two longitudinal traces, or a part of sub-pixel units of the display panel each adopt a structure including one longitudinal trace, and another part of sub-pixel units of the display panel each adopt a structure including two longitudinal traces. The above-described configuration is not limited and may be adjusted according to applications.

The above description is only exemplary and a description of principles of the technology of the present disclosure. Those skilled in the art should understand that the scope of the present disclosure is not limited to the technical solution formed by the specific combination of the above technical features, but also covers other technical solutions formed by the arbitrary combination of the above technical features or their equivalent features without departing from the concept of the present disclosure, for example, covers the technical solution formed by replacing the above features with (but not limited to) the technical features with similar functions disclosed in the present disclosure.

What is claimed is:

1. A display panel, comprising:
a base substrate, on which an active layer, a first insulating layer, a first gate layer, a second gate layer, and a first metal layer are stacked; and
an organic light emitting diode device arranged on a side, away from the base substrate, of the first metal layer, the organic light emitting diode device comprising a first electrode layer, a light emitting layer and a second electrode layer which are sequentially arranged on the base substrate,
wherein the first gate layer comprises a plurality of first energy storage capacitor plates, the second gate layer comprises a plurality of second energy storage capacitor plates, the first energy storage capacitor plates are in one-to-one correspondence with the second energy storage capacitor plates, each first energy storage capacitor plate and the second energy storage capacitor plate corresponding to said each first energy storage capacitor plate form an energy storage capacitor, an orthographic projection of each first energy storage capacitor plate on the base substrate is within an outline of an orthographic projection of the second energy storage capacitor plate, corresponding to said each first energy storage capacitor plate, on the base substrate,
the second energy storage capacitor plates are independent from each other, and adjacent ones of the second energy storage capacitor plates are spaced apart from each other,
the first metal layer comprises a second power signal line, and the second power signal line comprises at least one trace extending in a second direction,
the organic light emitting diode device belongs to one sub-pixel unit, the sub-pixel unit corresponds to the at least one trace extending in the second direction, the at least one trace extending in the second direction corresponding to the sub-pixel unit is arranged uniformly along a first direction, orthographic projections of the first direction and the second direction on the base substrate are intersected with each other,
each of the first electrode layer, the light emitting layer and the second electrode layer of the organic light emitting diode device is symmetrical with respect to a symmetry axis of the at least one trace extending in the second direction corresponding to the sub-pixel unit which the organic light emitting diode device belongs to, the symmetry axis extends in the second direction.

2. The display panel of claim 1, further comprising:
a data signal line, wherein an orthographic projection of the data signal line on the base substrate is not overlapped with orthographic projections of the second energy storage capacitor plates on the base substrate.

3. The display panel of claim 2, further comprising:
a first power signal line and a second power signal line, wherein the first power signal line and the second power signal line are arranged in different layers.

4. The display panel of claim 3, wherein the second power signal line comprises a plurality of traces in a first direction and a plurality of traces in a second direction, orthographic projections of the traces in the first direction on the base substrate are intersected with orthographic projections of the traces in the second direction on the base substrate.

5. The display panel of claim 4, wherein the traces in the first direction and the traces in the second direction are disposed in a same layer.

6. The display panel of claim 5, wherein, in a display area, the orthographic projections of the traces in the second direction on the base substrate are overlapped with an orthographic projection of the second gate layer on the base substrate.

7. The display panel of claim 5, wherein M sub-pixel units are provided between every two adjacent traces in the first direction;
N sub-pixel units are provided between every two adjacent traces in the second direction; and
M and N are positive integers.

8. The display panel of claim 4, further comprising:
an initialization voltage signal line, wherein, in a display area, the orthographic projections of the traces in the first direction on the base substrate are overlapped with an orthographic projection of the initialization voltage signal line on the base substrate.

9. The display panel of claim 8, wherein, in the display area, the orthographic projections of the traces in the second direction on the base substrate are overlapped with an orthographic projection of the second gate layer on the base substrate.

10. The display panel of claim 8, wherein M sub-pixel units are provided between every two adjacent traces in the first direction;
N sub-pixel units are provided between every two adjacent traces in the second direction; and
M and N are positive integers.

11. The display panel of claim 4, wherein, in a display area, the orthographic projections of the traces in the first direction on the base substrate are overlapped with an orthographic projection of the first power signal line on the base substrate.

12. The display panel of claim 11, wherein, in the display area, the orthographic projections of the traces in the second direction on the base substrate are overlapped with an orthographic projection of the second gate layer on the base substrate.

13. The display panel of claim 11, wherein M sub-pixel units are provided between every two adjacent traces in the first direction;

N sub-pixel units are provided between every two adjacent traces in the second direction; and M and N are positive integers.

14. The display panel of claim 4, wherein, in a display area, the orthographic projections of the traces in the first direction on the base substrate are overlapped with an orthographic projection of the data signal line on the base substrate.

15. The display panel of claim 14, wherein, in the display area, the orthographic projections of the traces in the second direction on the base substrate are overlapped with an orthographic projection of the second gate layer on the base substrate.

16. The display panel of claim 14, wherein M sub-pixel units are provided between every two adjacent traces in the first direction;

N sub-pixel units are provided between every two adjacent traces in the second direction; and M and N are positive integers.

17. The display panel of claim 4, wherein, in a display area, the orthographic projections of the traces in the second direction on the base substrate are overlapped with an orthographic projection of the second gate layer on the base substrate.

18. The display panel of claim 4, wherein M sub-pixel units are provided between every two adjacent traces in the first direction;

N sub-pixel units are provided between every two adjacent traces in the second direction; and M and N are positive integers.

19. The display panel of claim 1, further comprising:

a plurality of organic light emitting diode devices, wherein each of the organic light emitting diode devices comprises a first electrode layer, a light emitting layer and a second electrode layer which are sequentially arranged on the base substrate.

20. A display device, comprising the display panel of claim 1.

* * * * *